United States Patent [19]

Nagano

[11] Patent Number: 4,485,313

[45] Date of Patent: Nov. 27, 1984

[54] LOW-VALUE CURRENT SOURCE CIRCUIT

[75] Inventor: Katsumi Nagano, Hiratsuka, Japan

[73] Assignee: Tokyo Shibaura Denki Kabushiki Kaisha, Kawasaki, Japan

[21] Appl. No.: 361,092

[22] Filed: Mar. 23, 1982

[30] Foreign Application Priority Data

Mar. 27, 1981 [JP] Japan ............ 56-45050

[51] Int. Cl.³ ............ H03K 17/00; H03F 3/04

[52] U.S. Cl. ............ 307/296 R; 307/297; 323/315; 330/257

[58] Field of Search ............ 330/257, 288; 323/315; 307/297 R, 296 R

[56] References Cited

U.S. PATENT DOCUMENTS

| | | | |
|---|---|---|---|
| 3,320,439 | 5/1967 | Widlar . | |
| 3,573,645 | 4/1971 | Wheatley, Jr. | 330/288 |
| 3,930,172 | 12/1975 | Dobkin | 307/297 |
| 4,119,869 | 10/1978 | Hashimoto | 323/315 |
| 4,240,041 | 12/1980 | Hashimoto et al. | 330/288 |
| 4,350,904 | 9/1982 | Cordell | 330/288 |

OTHER PUBLICATIONS

IBM Technical Disclosure Bulletin, vol. 14, No. 4, Sep. 1971, pp. 1039 and 1040, New York (USA).

*Primary Examiner*—Stanley D. Miller
*Assistant Examiner*—B. P. Davis
*Attorney, Agent, or Firm*—Finnegan, Henderson, Farabow, Garrett & Dunner

[57] ABSTRACT

A current source circuit is arranged so as to provide a low-level current on the order of 0.1 microampere at a high level of accuracy. A series connection of first and second transistors, each having its base shunted to its collector, is connected between first and second power supply terminals so as to be supplied with a first given input current. The collector-emitter path of a third transistor and a resistor connected to the emitter of the third transistor are connected between the first and second power supply terminals so as to be supplied with a second input current the magnitude of which is n times that of the first input current. The base of the third transistor is connected to a current supply terminal of the series connection of the first and second transistors. A fourth transistor (output transistor) has its base-to-emitter junction connected between the resistor and the second power supply terminal, to provide its collector with an output current. Since the base-to-emitter voltage of the output transistor is reduced by a voltage drop across the resistor, the output current can be made small.

4 Claims, 7 Drawing Figures

LOW-VALUE CURRENT SOURCE CIRCUIT

BACKGROUND OF THE INVENTION

The present invention relates to a low-value current source circuit for providing a low-value output current.

There is known, as a bipolar integrated circuit arranged to provide a low-value current, a circuit as shown in FIG. 1 and disclosed in U.S. Pat. No. 3,320,439 to Widlar. In this circuit, if it is assumed that an input current I1 is 100 μA and an output current I2 is 0.1 μA, the value of a resistor R is given by $V_T/I2 \ln I1/I2 = 1.8$ MΩ. At the present stage of technology in this field, it is impossible to fabricate a resistor of 1 MΩ or more at a high level of accuracy.

A circuit using a base current of a transistor as a low-value current, as shown in FIG. 2, has also been known. In the circuit, when the emitter current I is 100 μA and the common emitter current amplification factor β is 100, the base current $I_B$ (=I/β) of 1 μA is obtained. This base current depends largely on the amplification factor β, so that its accuracy is poor. With present bipolar integrated circuits, the amplification factor β of a transistor will vary from 100 to 500. In the present bipolar integrated circuits, it is very difficult to fabricate current source circuits arranged to provide a very small current on the order of a μA or less.

SUMMARY OF THE INVENTION

It is an object of this invention to provide a current source circuit arranged to provide a low-value current at a high level of accuracy.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, a series circuit of first and second transistors each having its base shunted to its collector, and an input current source for supplying the series circuit with a first input current are connected between first and second power supply terminals. A collector-to-emitter path of a third transistor, an emitter resistor connected to the emitter of the third transistor and a current supply circuit for supplying the third transistor and the emitter resistor with a second input current the magnitude of which is n times that of the first input current are connected in series between the first and second power supply terminals. The base of the third transistor is connected to the current supply terminal of the series circuit of the first and second transistors. The base-to-emitter junction of a fourth transistor (output transistor) is connected between the emitter resistor and the second power supply terminal, to provide an output current to its collector.

According to the present invention, the base-to-emitter voltage of the output transistor is reduced by a voltage drop across the emitter resistor resulting from the current fed from the current supply circuit so that the output current can be made small.

In order to further reduce the output current, it is desired that the emitter area of the first and second transistors be made larger than the emitter area of the third and fourth transistors.

DETAILED DESCRIPTION OF THE PREFERRED EMBODIMENT

Figure 1:
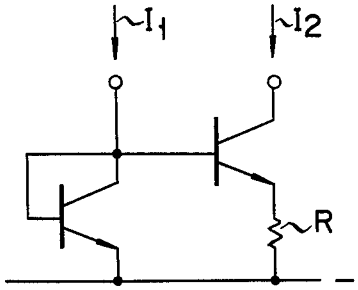
FIG. 1 (PRIOR ART)
FIGS. 1 and 2 show prior art current source circuits.
Figure 2:
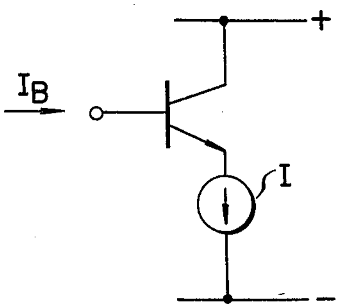
FIG. 2 (PRIOR ART)
Figure 3:
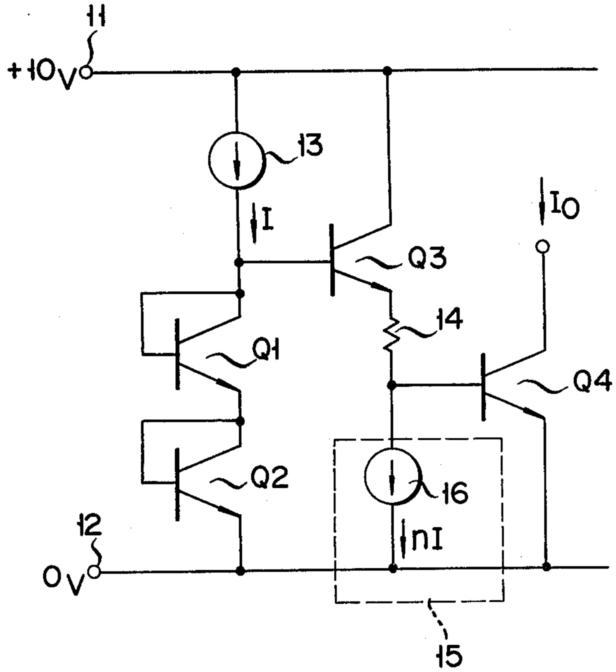
FIG. 3 is a schematic circuit diagram embodiment of a current source circuit constructed according to the present invention.

Referring to FIG. 3, there is shown a schematic circuit diagram of a current source circuit embodying the present invention which comprises an input current source 13 for providing an input current I and NPN transistors Q1 and Q2 each having its base shunted to its collector are connected in series between a positive power supply terminal 11 and a negative power supply terminal 12. The current source circuit is further provided with an NPN transistor Q3 having its base connected to the collector of transistor Q1 and its collector connected to positive power terminal 11, a resistor 14 connected to the emitter of transistor Q3, a current supply circuit 15 connected between resistor 14 and negative power supply terminal 12 and having a current source 16 to feed a current nI which is in magnitude n times (n is a positive number, preferably a positive integer) the input current I to transistor Q3, and an NPN transistor Q4 having its base connected to a connection point between resistor 14 and current supply circuit 15, its emitter connected to negative power supply terminal 12 and providing an output current Io to its collector.

In the present embodiment, transistors Q1 to Q4 have emitter areas m1 to m4, respectively, which are set such that m1>m3, m4; and m2>m3, m4. Further, if the emitter areas of transistors Q3 and Q4 are each A (=m3=m4), the emitter areas of transistors Q1 and Q2 are each mA (m1=m2, m>1). It is not essential to the present invention, however, that the emitter areas of transistors Q1 and Q2 are larger than those of transistors Q3 and Q4. Transistors Q1 to Q4 may have an identical emitter area. If transistors Q1 and Q2 have larger emitter area than transistors Q3 and Q4, then the base-to-emitter voltage $V_{BE}$ of each of transistors Q1 and Q2 can further be reduced, so that a smaller output current Io may be provided. In the present embodiment, the potential at positive power supply terminal 11 is set at +10 V, and the potential at negative power supply terminal 12 at 0 V (ground potential). It is noted that the current source circuit shown in FIG. 3 can be operated from a power supply voltage of about 1.5 V.

Figure 4:
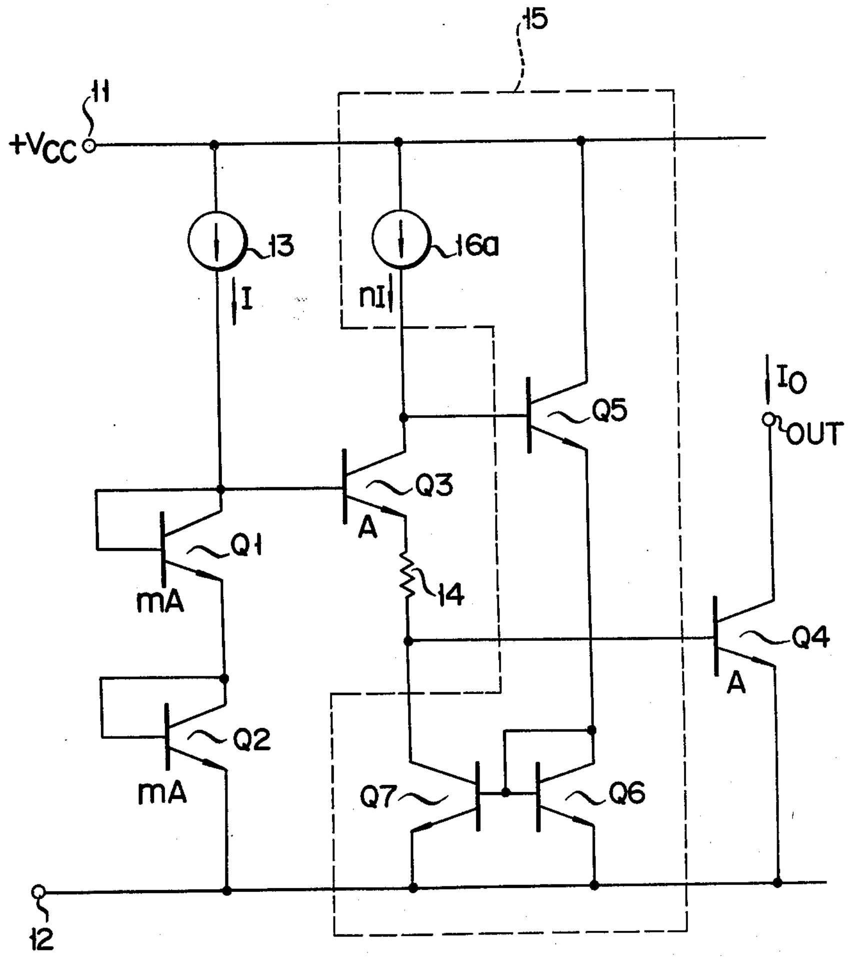
FIG. 4 is a practical circuit diagram of a current source circuit constructed according to the present invention.

FIG. 4 shows in particular a practical arrangement of current supply circuit 15 of FIG. 3. In the arrangement of current supply circuit 15, a current source 16*a* for providing a current nI is connected between the collector of transistor Q3 and positive power supply terminal 11, and an NPN transistor Q5 is provided which has its base connected to the collector of transistor Q3 and its collector connected to positive power supply terminal 11. Moreover, a pair of NPN transistors Q6 and Q7 are provided which are connected in a current mirror configuration. Diode-connected transistor Q6 of the current mirror has its collector connected to the emitter of transistor Q5 and its emitter connected to negative power supply terminal 12. Transistor Q7 has its collector connected to the emitter of transistor Q3 through emitter resistor 14 thereof and its emitter connected to negative power supply terminal 12.

In the circuit of FIG. 4, transistors Q1 to Q3, resistor 14, and output transistor Q4 constitutes an essential part of the low-value current source. Current sources 13 and 16*a* supply input currents I and nI to the collectors of transistors Q1 and Q3, respectively. Transistor Q5 and current-mirror transistors Q6 and Q7 serve to make the collector current of transistor Q3 equal to nI. As seen from the circuit diagram, the current source circuit of this invention is arranged to make output current Io small by reducing the base-to-emitter voltage of output transistor Q4 by a voltage drop across resistor 14 caused by current supplied from current source 16*a*.

The operation of the current source circuit of FIG. 4 will be discussed quantitatively with respect to a first circuit section comprised of transistors Q1 to Q4 and transistor 14 to determine output current Io and a second circuit section comprised of transistors Q5 to Q7 to determine collector current of transistor Q3.

In operation of the second circuit section, since base voltage $V_B(Q3)$ of transistor Q3 is the sum of base-to-emitter voltage $V_{BE}$ of transistors Q1 and Q2, $$V_B(Q3)=V_{BE}(Q1)+V_{BE}(Q2)\simeq 2V_{BE} \quad (1)$$

The emitter voltage $V_E(Q3)$ of transistor Q3 is $$V_E(Q3)=V_{BE}(Q4)+R1.I_E(Q3) \quad (2)$$

where $V_{BE}(Q4)$ is base-to-emitter voltage of output transistor Q4, R1 is value of resistor 14 and $I_E(Q3)$ is emitter current of transistor Q3. If the voltage drop across resistor 14 is negligible, equation (2) can be rewritten into $$V_E(Q3)\simeq V_{BE}(Q4) \quad (3)$$

Since the collector voltage $V_C(Q3)$ of transistor Q3 is the sum of the base-to-emitter voltages $V_{BE}$ of transistors Q5 and Q6, $$V_C(Q3)=V_{BE}(Q5)+V_{BE}(Q6)\simeq 2V_{BE} \quad (4)$$

It will be understood from equations (2), (3) and (4) that the collector-to-emitter voltage $V_{CE}$ is substantially equal to $V_{BE}$ and thus transistor Q3 operates in the active region. When the common emitter amplification factor $\beta$ of transistor is sufficiently large, the collector current Ic(Q3) of transistor Q3 may be considered to be equal to the emitter current $I_E(Q3)$. Therefore, current equations at the collector and the emitter of transistor Q3 are as follows $$nI=Ic(Q3)+I_B(Q5) \quad (5)$$

$$Ic(Q3)=I_B(Q4)+Ic(Q7) \quad (6)$$

Since transistors Q6 and Q7 forms a current mirror circuit, $$Ic(Q6)=Ic(Q7) \quad (7)$$

Since the collector current Ic(Q6) of transistor Q6 is the emitter current $I_E(Q5)$ of transistor Q5, $$I_E(Q5)=Ic(Q6) \quad (8)$$

If the base current $I_B(Q4)$ of output transistor Q4 is negligible, then equations (6), (7) and (8) yield $$I_E(Q5)=Ic(Q3) \quad (9)$$

Since the base current $I_B(Q5)$ of transistor Q5 is $1/\beta$ of the emitter current, $$I_B(Q5)=\frac{1}{\beta}\cdot I_E(Q5) \quad (10)$$

Substituting equation (10) into equation (5) yields $$nI=\left(1+\frac{1}{\beta}\right)\cdot Ic(Q3) \quad (11)$$

Since $\beta$ is sufficiently large, equation (11) can be rewritten into $$Ic(Q3)=nI \quad (12)$$

The equation indicates that the collector current Ic(Q3) of transistor Q3 is equal to the output current nI of current source 16*a*.

The operation of the first circuit section to determine the output current Io will be described. The base-to-emitter voltage $V_{BE}$ and the collector current Ic of a transistor are related as follows:

$$V_{BE}=V_T\ln\frac{Ic}{A\cdot Is} \quad (13)$$

where $V_T$ is the electronvolt equivalent of the temperature, A is emitter area, and Is is reverse saturation current.

The equation of a loop formed of transistors Q1 to Q3, resistor 14 and output transistor Q4 is given by $$V_{BE}(Q1)+V_{BE}(Q2)=V_{BE}(Q3)+nI\cdot R1+V_{BE}(Q4) \quad (14)$$

Substituting equation (13) into equation (14) yields $$V_T\ln\frac{1}{m1\cdot A\cdot Is}+V_T\ln\frac{1}{m2\cdot A\cdot Is}=V_T\ln\frac{nI}{m3\cdot A\cdot Is}+nI\cdot R1+V_T\ln\frac{Io}{m4\cdot A\cdot Is} \quad (15)$$

Assuming that the emitter areas are such that m1=m2=m and m3=m4=1, equation (15) can be rewritten into $$2V_T\ln\frac{I}{m\cdot A\cdot Is}=V_T\ln\frac{nI}{A\cdot Is}+nI\cdot R1+V_T\ln\frac{Io}{A\cdot Is} \quad (16)$$

Solving equation (16) for output current Io gives $$V_T\ln\frac{I}{m^2nIo}=nI\cdot R1, \quad (17)$$

-continued $$\frac{I}{m^2 n I o} = e^{\frac{nI \cdot R1}{VT}}$$

$$Io = \frac{I}{m^2 n} e^{-\frac{nI \cdot R1}{VT}}$$

It will be understood, therefore, that the output current Io of output transistor Q4 depends on the emitter area ratio m of transistors, the current ratio n of current sources 13 and 16*a*, and the value R1 of resistor 14. The above is the operation of the first circuit section comprised of transistors Q1 to Q4 and resistor 14.

Figure 5:
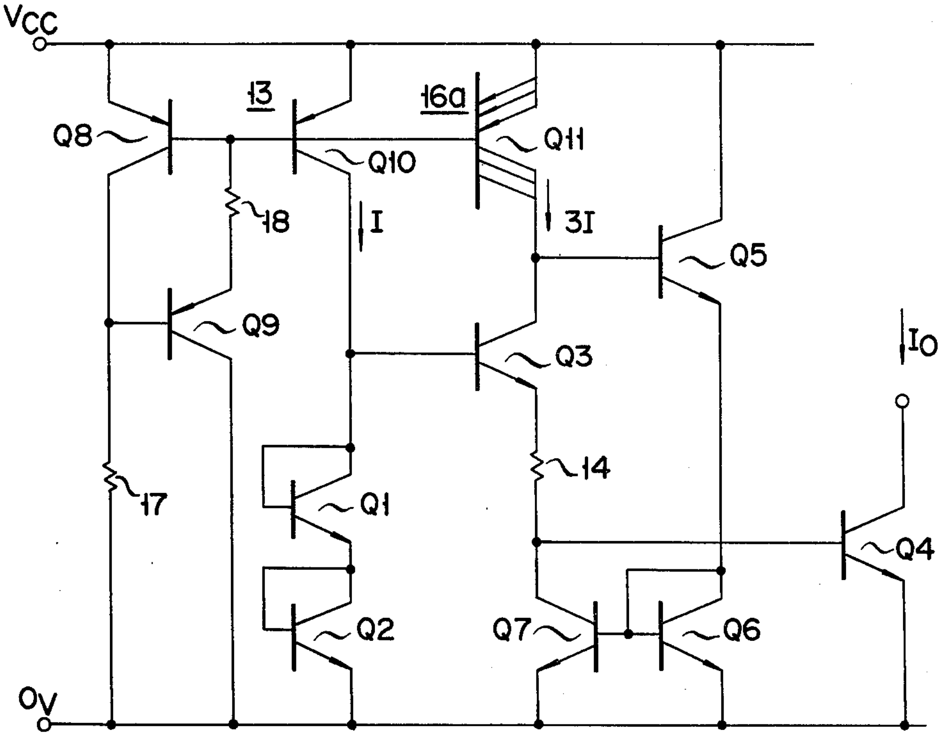
FIG. 5 is a practical arrangement of the current source shown in FIG. 4.

FIG. 5 shows an experimental circuit of the current source circuit of this invention. In the experimental circuit, if I=100 μA, m=1, n=3, R1=500Ω, and $V_T$=26 mV (T=300° K.), then the output current Io is found to be 0.10 μA from equation (17). In other words, when the input current I of 100 μA is given, the output current Io of 0.1 μA, 1/1000 of the input current results. In the experimental circuit, the circuit section comprised of the transistors Q1 to Q4 and the resistor R14 is the same as that of the circuit of FIG. 4, and transistors Q8 to Q11 and resistors 17 and 18 form current sources 13 and 16*a*. Transistor Q11 is formed to have an emitter area three times that of transistor Q10 so that the output currents of current sources 13 and 16*a* are I and 3I (n=3), respectively. The values of resistors 17 and 18 are 86 KΩ and 2.2 KΩ, respectively. The input current I is $$I = \frac{1}{R2}(V_{CC} - 2V_{BE}) \tag{18}$$

where R2 is the value of resistor 17.

When current flowing through resistor 17 was changed in the circuit of FIG. 5, the measured values of collector current I of transistor Q10, the collector current 3I of transistor Q11, the voltage drop $V_R$ across resistor 14, and the output current Io were obtained as shown in Table below.

TABLE

| I | 3I | $V_R$ | Io (MEASURED) | Io (CALCULATED) | ERROR |
|---|---|---|---|---|---|
| 132 μA | 422 μA | 187.6 mV | 0.0161 μA | 0.0305 μA | −4.7% |
| 110 | 350 | 155.8 | 0.0827 | 0.0874 | −5.3 |
| 100 | 319 | 141.9 | 0.126 | 0.136 | −7.4 |
| 90 | 290 | 128.3 | 0.193 | 0.207 | −6.8 |
| 81 | 258 | 114.1 | 0.301 | 0.324 | −7.1 |
| 70 | 226 | 99.71 | 0.464 | 0.489 | −5.1 |
| 60 | 192 | 84.5 | 0.709 | 0.756 | −6.2 |
| 50 | 161 | 70.5 | 1.017 | 1.084 | −6.1 |
| 40 | 128 | 56.1 | 1.411 | 1.515 | −6.9 |
| 30 | 97 | 41.9 | 1.820 | 1.971 | −7.7 |
| 20 | 65 | 27.7 | 2.085 | 2.278 | −8.5 |
| 10 | 32 | 13.4 | 1.766 | 1.983 | −10.9 |

The calculated value of output current Io for estimating an error of the measured values was obtained by substituting the measured input current I and the measured voltage drop $V_R$ into the following equation which is a modification of equation (17).

$$Io(\text{calculated}) = \frac{I}{3} \cdot e^{-\frac{VR}{VT}} \tag{19}$$

Figure 6:
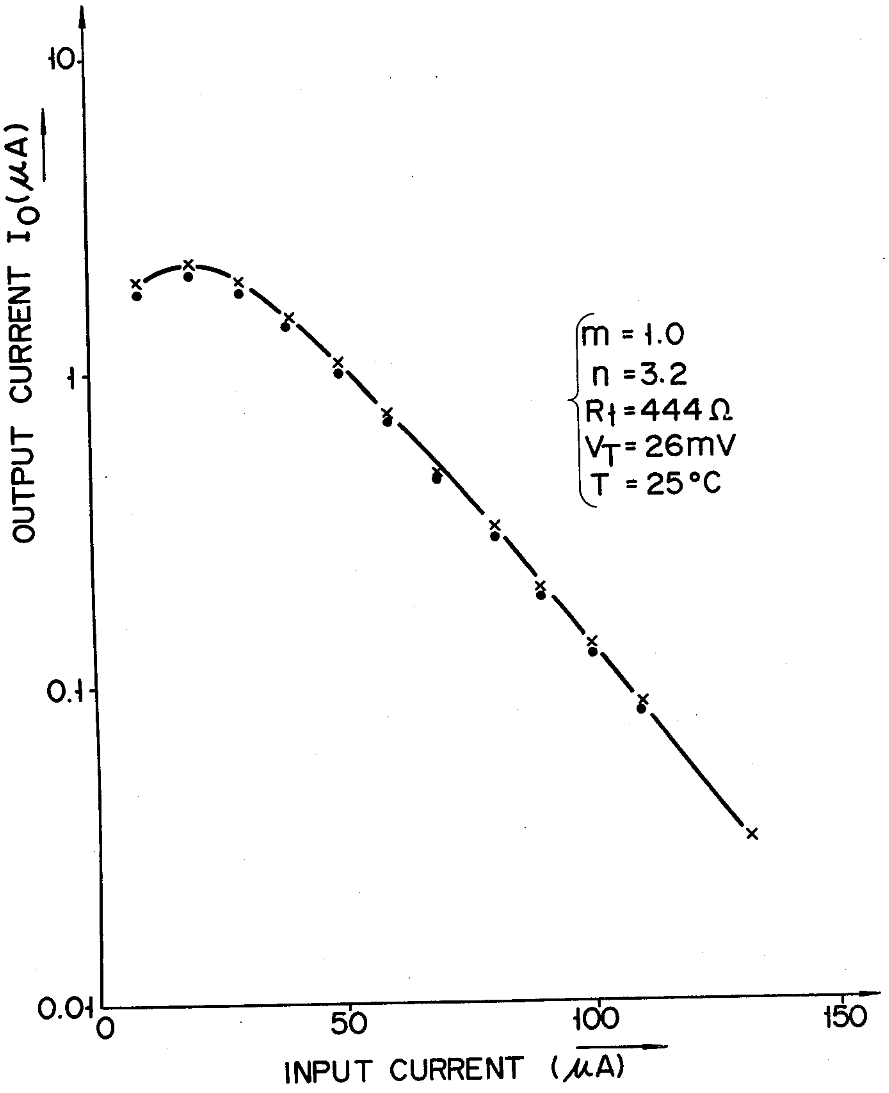
FIG. 6 is a graph which shows an output characteristic of a current source circuit shown in FIG. 5.

When comparing the calculated values with the measured values, the error of current Io can be deemed about −7%, as shown in the table. This implies that the current source circuit of the present invention is sufficiently practicable and able to provide a low-value current on the order of 0.1 μA at high accuracy. FIG. 6 shows an output characteristic of input current versus output current. In this graph, the measured values are denoted by dots (·) and calculated values by X.

As the transistors in the experimental circuit, transistors in bipolar integrated transistor arrays were. The used integrated circuit chips used were one packed into 16-pin dual in-line plastic packages. Thus, in the case of plastic package, current of 0.1 μA can effectively be handled.

Figure 7:
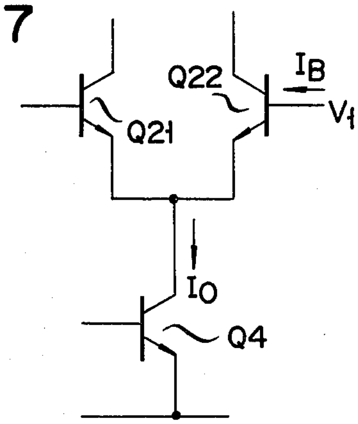
FIG. 7 shows a differential amplifier circuit using, as a constant current source therefor, a current source circuit of the present invention.

The current source circuit of the present invention is well suitable for a constant current source of a differential amplifier circuit. As shown in FIG. 7, when the current source circuit is used as a constant current source for transistors Q21 and Q22, the differential amplifier circuit is operable when an input voltage $V_I$ is above $V_{BE}$(Q22)+$V_{CE}$(Q4)=0.7 V+0.1 V=0.8 V. For example, when Io=1 μA, and β of transistor Q22 is 10, the base current $I_B$ becomes 0.1 μA when transistor Q22 is in an active condition. Accordingly, a high input impedance of about 10 MΩ can be provided.

What is claimed is:

1. A current source circuit comprising:

first and second power supply terminals between which a power source voltage is applied;

a series circuit of first and second bipolar transistors each having its base shunted to its collector, said series circuit being coupled between said first and second power supply terminals;

an input current source coupled between said first power supply terminal and the collector of said first transistor for supplying an input current to said series connection of said first and second transistors;

a third bipolar transistor having its base coupled to the collector of said first transistor and its collector-to-emitter path coupled between said first and second power supply terminals;

a resistor coupled between the emitter of said third transistor and said second power supply terminal;

a current supply circuit connected in said second collector-to-emitter path for supplying said third transistor with a current the magnitude of which is n times that of the input current; and a fourth bipolar transistor having its base coupled to the emitter of said third transistor through said resistor, its emitter coupled to said second power supply terminal, and providing an output current to its collector.

2. A current source circuit according to claim 1 wherein said first and second transistors have emitter areas larger than those of said third and fourth transistors.

3. A current source circuit according to claim 1 wherein said current supply circuit includes a current source coupled between said resistor and said second power supply terminal.

4. A current source circuit according to claim 1 wherein said current supply circuit includes a current source coupled between the collector of said third transistor and said first power supply terminal, a fifth transistor having its base coupled to the collector of said third transistor and its collector to said first power supply terminal, a sixth transistor having its base and collector coupled together to the emitter of said fifth transistor and its emitter to said second power supply terminal, and a seventh transistor having its base coupled to the base of said sixth transistor, its collector to the emitter of said third transistor through said resistor, and its emitter to said second power supply terminal.

* * * * *